United States Patent
Kim et al.

(10) Patent No.: US 11,184,025 B2
(45) Date of Patent: Nov. 23, 2021

(54) LDPC DECODING METHOD AND LDPC DECODING APPARATUS

(71) Applicants: ELECTRONICS AND TELECOMMUNICATIONS RESEARCH INSTITUTE, Daejeon (KR); Research & Business Foundation SUNGKYUNKWAN UNIVERSITY, Suwon-si (KR)

(72) Inventors: Sang-Hyo Kim, Seongnam-si (KR); Gi Yoon Park, Daejeon (KR); Ok-Sun Park, Daejeon (KR); Hyunjae Lee, Suwon-si (KR); Hyosang Ju, Suwon-si (KR); Jaesheung Shin, Sejong-si (KR)

(73) Assignees: ELECTRONICS AND TELECOMMUNICATIONS RESEARCH INSTITUTE, Daejeon (KR); RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 0 days.

(21) Appl. No.: 17/159,681

(22) Filed: Jan. 27, 2021

(65) Prior Publication Data
US 2021/0242885 A1 Aug. 5, 2021

(30) Foreign Application Priority Data
Feb. 4, 2020 (KR) .................... 10-2020-0013191

(51) Int. Cl.
*H03M 13/11* (2006.01)
*H03M 13/09* (2006.01)
(Continued)

(52) U.S. Cl.
CPC ....... *H03M 13/1151* (2013.01); *H03M 13/09* (2013.01); *H03M 13/1111* (2013.01); *H03M 13/1575* (2013.01); *H03M 13/3769* (2013.01)

(58) Field of Classification Search
CPC .................................................. H03M 13/1151
(Continued)

(56) References Cited

U.S. PATENT DOCUMENTS 7,130,763 B2 * 10/2006 Keinan ................. G06Q 10/04
702/182
9,379,922 B2 6/2016 Lim et al.
(Continued)

OTHER PUBLICATIONS

Xiao Dongliang et al., "A Perturbation Method for Decoding LDPC Concatenated with CRC", 2007 IEEE Wireless Communications and Networking Conference;2007; ; ;10.1109/WCNC.2007.128.
(Continued)

*Primary Examiner* — Fritz Alphonse
(74) *Attorney, Agent, or Firm* — LRK Patent Law Firm

(57) ABSTRACT

An LDPC decoding method of a received signal including a plurality of received symbols is provided. A decoding apparatus selects a perturbation space in which perturbation is to be performed based on a code length of the received signal and a maximum number of perturbation rounds indicating a number of perturbation rounds that can be performed, and performs a perturbation round. The decoding apparatus performs perturbation on a corresponding received symbol among the plurality of received symbols in each perturbation round, and decodes the received signal on which the perturbation has been performed. The decoding apparatus determines that decoding is successful when there is a perturbation round in which a decoding result of the received signal satisfies a predetermined condition.

20 Claims, 16 Drawing Sheets

(51) Int. Cl.
  *H03M 13/37* (2006.01)
  *H03M 13/15* (2006.01)
(58) Field of Classification Search
  USPC .......................................................... 714/752
  See application file for complete search history.

(56) References Cited

U.S. PATENT DOCUMENTS

| | | |
|---|---|---|
| 9,628,113 B2 | 4/2017 | Jeong et al. |
| 9,641,198 B2 | 5/2017 | Jeong et al. |
| 9,648,628 B2 | 5/2017 | Lim et al. |
| 9,660,669 B2 | 5/2017 | Jeong et al. |
| 9,667,381 B2 | 5/2017 | Jeong et al. |
| 9,755,784 B2 | 9/2017 | Jeong et al. |
| 10,447,308 B2 | 10/2019 | Park et al. |
| 2005/0071387 A1* | 3/2005 | Mitchell ............. G06F 11/3466 |
| 2005/0071460 A1* | 3/2005 | Mitchell ............... G06F 11/366 709/224 |

OTHER PUBLICATIONS

Eun Chong Baek et al. "Decoding LDPC Codes with Binary Perturbation", 2016 International Conference on Information and Communication Technology Convergence (ICTC);2016; ; ;10.1109/ICTC.2016.7763563.

S. Scholl et al., "Saturated Min-Sum Decoding", 2016 Design, Automation & Test in Europe Conference & Exhibition (DATE);2016.

Peng Kang et al., "Enhanced Quasi-Maximum Likelihood Decoding of Short LDPC Codes Based on Saturation", 2019 IEEE Information Theory Workshop (ITW).

Nedeljko Varnica et al., "Augmented Belief Propagation Decoding of Low-Density Parity Check Codes", IEEE Transactions on Communications, vol. 55, No. 7, Jul. 2007.

Hyunjae Lee et al., "Multi-Round Belief Propagation Decoding With Impulsive Perturbation for Short LDPC Codes", IEEE Wireless Communications Letters, vol. 9, No. 9, Sep. 2020.

* cited by examiner

LDPC DECODING METHOD AND LDPC DECODING APPARATUS

CROSS-REFERENCE TO RELATED APPLICATION

This application claims priority to and the benefit of Korean Patent Application No. 10-2020-0013191 filed on Feb. 4, 2020, the entire content of which is incorporated herein by reference.

BACKGROUND

1. Field of the Invention

The described technology generally relates to an low-density parity check (LDPC) decoding method and an LDPC decoding apparatus.

2. Description of Related Art

Ultra-reliable and low latency communications (URLLC) is a wireless communication technology for successfully delivering packets having stringent latency and reliability requirements. Representative services of the URLLC include V2X (vehicle-to-everything), IIoT (industrial internet of things), smart grid systems, and unmanned aerial vehicles. For stable support of various URLLC services, the 5G mobile communication standard has discussed requirements such as a short data length, latency of 1 ms or less for uplink/downlink, and a block error rate (BLER) of $10^{-5}$ or less without an error floor. In order to satisfy the discussed requirements of the URLLC services, an improved physical layer technology should be developed compared with the existing system. It is necessary to apply a channel coding scheme with excellent performance to satisfy the high reliability among the requirements.

LDPC codes are powerful channel codes that achieve the Shannon's channel capacity limit. Due to an excellent error correction capability and a structure suitable for parallelization in hardware implementation, the LDPC codes are used in various fields such as mobile communication and digital broadcasting. The LDPC codes have been recently adopted as channel codes for data transmission in an enhanced mobile broadband (eMBB) scenario of the 5G standard. In general, the LDPC codes achieve excellent performance by using a belief propagation (BP) decoding scheme. The BP decoding scheme is a decoding process of repeatedly exchanging information received from a channel through message on a bipartite graph and probabilistically inferring an original codeword. Although the BP decoding scheme can achieve sufficiently excellent decoding performance in long LDPC codes, it cannot achieve the excellent performance gain in short LDPC codes compared to the long LDPC codes, due to structural limitations of the LDPC code. That is, there is a limit to achieving the reliability requirement when applying the existing BP decoding schemes of LDPC codes to the short data length of the URLLC.

In order to address the issue of decoding performance degradation in the short code length, various schemes related to the design and decoding technology of LDPC codes are being studied. Although a scheme of repeatedly BP decoding by applying the perturbation has been proposed, there are shortcomings in that the computation (or implementation) complexity and decoding time increase due to the iterative perturbations. In addition, additional computational complexity occurs due to the detailed operation of the perturbation, and there are restrictions in flexibly operating the decoder.

SUMMARY

Some embodiments provide an LDPC decoding method and an LDPC decoding apparatus capable of lowering computational complexity while improving decoding performance.

According to some embodiments, an LDPC decoding method of a received signal including a plurality of received symbols is provided. The method includes selecting a perturbation space in which perturbation is to be performed based on a code length of the received signal and a maximum number of perturbation rounds indicating a number of perturbation rounds that can be performed, performing at least one perturbation round, performing perturbation on a corresponding received symbol among the plurality of received symbols in each perturbation round, decoding the received signal on which the perturbation has been performed, and determining that decoding is successful when there is a perturbation round in which a decoding result of the received signal satisfies a predetermined condition among the at least one perturbation round. The at least one perturbation round includes a plurality of first perturbation rounds for performing the perturbation on a corresponding one symbol among the plurality of received symbols.

In some embodiments, the selecting the perturbation space may include setting a dimension of the perturbation space to be equal to the maximum number of perturbation rounds when the maximum number of perturbation rounds is less than or equal to the code length of the received signal.

In some embodiments, the selecting the perturbation space may include setting a dimension of the perturbation space to be equal to the code length of the received signal when the maximum number of perturbation rounds is greater than the code length of the received signal. In this case, the at least one perturbation round may further include at least one second perturbation round for performing the perturbation on corresponding s received symbols among the plurality of received symbols wherein s is an integer greater than one.

In some embodiments, the performing the at least one perturbation round may include, when the decoding result of the received signal does not satisfy the predetermined condition in one perturbation round, performing a next perturbation round.

In some embodiments, the performing the at least one perturbation round may include performing a plurality of perturbation rounds in parallel.

In some embodiments, the perturbation may include a process of flipping the corresponding received symbol and multiplying the flipped received symbol with a noise of a predetermined amplitude.

In some embodiments, the method may further include generating a perturbation pattern for a plurality of perturbation rounds corresponding to the maximum number of perturbation rounds, and the perturbation pattern may indicate an index of the corresponding received symbol in each perturbation round. In this case, the plurality of perturbation rounds may be prioritized in ascending order of a number of corresponding received symbols. Further, when the number of corresponding received symbols is same, the plurality of perturbation rounds may be prioritized in ascending order of reliability of corresponding received symbols.

In some embodiments, the decoding the received signal may include decoding the received signal on which the perturbation has been performed using a belief propagation (BP) decoding scheme.

In some embodiments, the method may further include calculating a number of sign mismatches of variable nodes (nSMV), and when the number of sign mismatches in a first received symbol among the plurality of received symbols is greater than the number of sign mismatches in a second received symbol among the plurality of received symbols, determining that reliability of the first received symbol is lower than reliability of the second received symbol.

In some embodiments, the decoding the received signal may include calculating a log likelihood ratio of the received signal on which the perturbation has been performed, and decoding the received signal on which the perturbation has not been performed based on the log likelihood ratio.

In some embodiments, the predetermined condition may include a condition in which an LDPC syndrome check according to the decoding result and a cyclic redundancy check ( ) check of a codeword according to the decoding result are passed.

In some embodiments, the predetermined condition may include a condition in which an LDPC syndrome check according to the decoding result and a maximum likelihood check according to the decoding result are passed.

According to some embodiments, an LDPC decoding apparatus of a received signal including a plurality of received symbols is provided. The apparatus includes a memory that stores one or more instructions, and a processor. The processor by executing the one or more instructions selects a perturbation space in which perturbation is to be performed based on a code length of the received signal and a maximum number of perturbation rounds indicating a number of perturbation rounds that can be performed, performs perturbation on a corresponding received symbol among the plurality of received symbols in each perturbation round, decodes the received signal on which the perturbation has been performed in each perturbation round, when a decoding result of the received signal satisfies a predetermined condition in each perturbation round, determines that decoding is successful, and when the decoding result of the received signal fails to satisfy the predetermined condition in each perturbation round, proceeds to a next perturbation round among the plurality of perturbation rounds. The plurality of perturbation rounds include a plurality of first perturbation rounds for performing the perturbation on a corresponding one symbol among the plurality of received symbols.

According to some embodiments, an LDPC decoding apparatus of a received signal including a plurality of received symbols is provided. The apparatus includes a memory that stores one or more instructions, and a processor. The processor by executing the one or more instructions sets the plurality of received symbols as a perturbation space, performs a plurality of perturbation rounds in parallel, performs perturbation on a corresponding received symbol among the plurality of received symbols in each perturbation round, decodes the received signal on which the perturbation has been performed in each perturbation round, and when there is a perturbation round in which a decoding result of the received signal satisfies a predetermined condition among the plurality of perturbation rounds, determines that decoding is successful. The plurality of perturbation rounds include a plurality of first perturbation rounds for performing the perturbation on a corresponding one symbol among the plurality of received symbols.

DETAILED DESCRIPTION OF THE EMBODIMENTS

Figure 1:
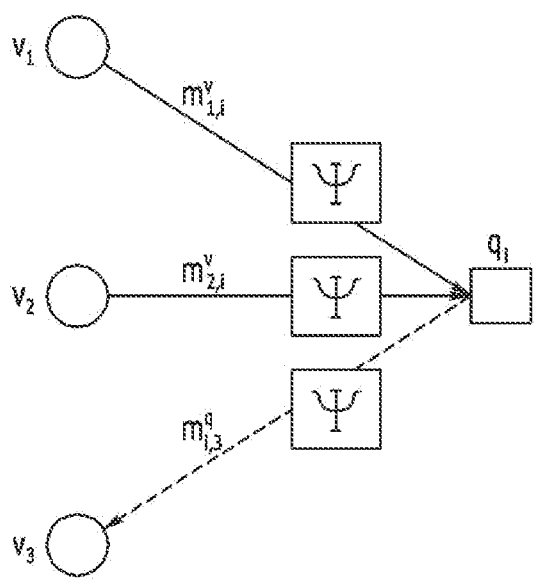
FIG. 1 is a diagram showing an example process of updating a check node in an example in which three variable nodes are connected to a check node.

In the following detailed description, only certain embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

First, a system model of a communication system according to some embodiments is described.

In some embodiments, a system model may use a binary LDPC code of a systematic structure with a code length of n and a message length of k. A codeword generated in the system model transmits a symbol $x=(x_1, x_2, \ldots, x_n)$ to which a modulation scheme, for example, a binary phase shift keying (BPSK) modulation scheme is applied. A transmission channel is assumed to be an additive white Gaussian noise channel, and a signal $r=(r_1, r_2, \ldots, r_n)$ received by a receiver $r=(r_1, r_2, \ldots, r_n)$ is expressed as $r=x+z$. Here, z is a Gaussian noise vector whose size is n and in which each element has a mean of zero and a variance of $\sigma^2$. Further, an estimated codeword, which is an output value of a decoder, is expressed as $\hat{c}=(\hat{c}_1, \hat{c}_2, \ldots, \hat{c}_n)$.

Next, LDPC codes and various decoding methods of the LDPC codes used in a communication system according to some embodiments are described with reference to FIG. 1 to FIG. 6.

LDPC codes are an error correction code that can approach the Shannon's channel capacity limit. The LDPC codes have a structure suitable for parallelization in hardware implementation. A binary LDPC code with a code length of n and a parity length of m is defined by a sparse binary matrix H, and a relationship $Hc^T=0$ is always satisfied for any codeword of the LDPC code $c=(c_1, c_2 \ldots, c_n)$. Here, H is referred to as a parity-check matrix, and is called low-density because very few non-zero elements exist in an n×m parity check matrix compared to the size of the matrix. The parity check matrix H may be expressed in a bipartite graph called a Tanner graph. The bipartite graph is composed of a set of variable nodes $V=(v_1, v_2 \ldots, v_n)$, a set of check nodes $Q=(q_1, q_2 \ldots, q_n)$, and a set of edges E connecting the variable nodes and the check nodes. If a value of $H_{ji}$, which is an element in the j-th row and i-th column of H, is one (1), the j-th variable node $v_j$ and the i-th check node $q_i$ are connected to each other by a connecting line. Therefore, the variable node set and the check node set correspond to the column and row of the parity check matrix, respectively. Further, the variable node is represented by each bit of the codeword, and the check node is represented by a linear binary constraint.

In some embodiments, the LDPC code may be decoded by using belief propagation (BP) using a message passing method. The BP decoding may be performed based on probabilistic inference through the message passing on a cycle-free bipartite graph. As the code length increases, the BP decoding exhibits a performance closer to the maximum a posteriori. In the BP decoding, there are a sum-product algorithm (SPA), a min-sum algorithm (MSA), and modifications thereof according to calculation methods. In the following, the SPA among the BP decoding algorithm is described with reference to FIG. 1 and FIG. 2.

Figure 2:
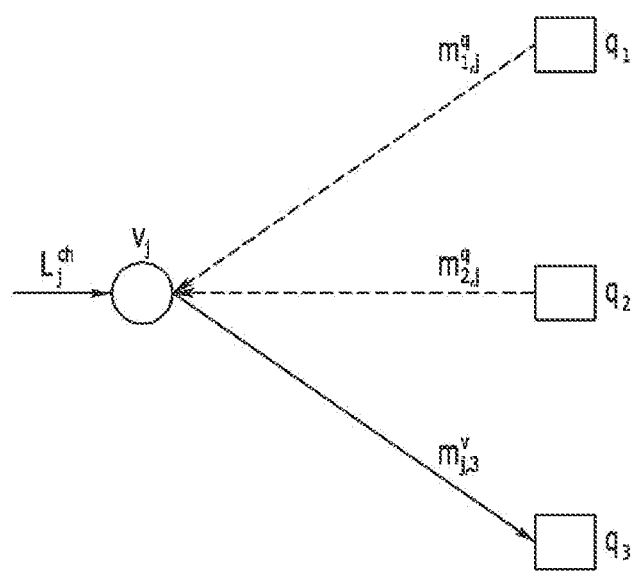
FIG. 2 is a showing an example process of updating a variable node in an example in which three check nodes are connected to a variable node.

FIG. 1 is a diagram showing an example process of updating a check node in an example in which three variable nodes are connected to a check node, and FIG. 2 is a showing an example process of updating a variable node in an example in which three check nodes are connected to a variable node.

First, an LDPC decoder calculates a log likelihood ratio (LLR) $L^{ch}=(L_1^{ch}, L_2^{ch}, \ldots, L_n^{ch})$ of a received signal, which is a message for each bit value, from a received symbol, as in Equation 1.

$$L^{ch} = \frac{2r}{\sigma^2} \qquad \text{Equation 1}$$

Second, the LDPC decoder places an LLR value $L_j^{ch}$ in the corresponding variable node $v_j$, and passes, as a message value, the LLR value $L_j^{ch}$ to a neighboring check node connected to each variable node $v_j$.

Third, as shown in FIG. 1, the check node $q_i$ performs a message passing operation that processes the message value $m_{j',i}^v$ passed from the neighboring variable node $v_{j'}$ as in Equation 2 to calculate a message value $m_{i,j}^q$ and passes the message value $m_{i,j}^q$ to the neighboring variable node $v_j$.

$$m_{i,j}^q = 2\tanh^{-1}\left(\prod_{j' \in N(c_i)\setminus j} \tanh\frac{m_{j',i}^v}{2}\right) = $$

$$\prod_{j' \in N(q_i)\setminus j} \text{sgn}(m_{j',i}^v) \cdot \Psi^{-1}\left(\sum_{j' \in N(q_i)\setminus j} \Psi(|m_{j',i}^v|)\right) \qquad \text{Equation 2}$$

where $\Psi(x) = \log\left(\coth\left(\frac{x}{2}\right)\right)$ and $\Psi^{-1}(x) = \Psi(x)$ In Equation 2, $N(\cdot)$ denotes a neighboring node connected to a node.

Fourth, as shown in FIG. 2, the variable node $v_j$ performs a message passing operation that processes $L_j^{ch}$ and a message value $m_{i,j}^q$ obtained from the neighboring check node $q_i$, to calculate a message value to be passed to the neighboring check node as in Equation 3 and passes the message value to the neighboring check node.

$$L_j = \sum_{i' \in N(v_j)} m_{i',j}^q + L_j^{ch} \qquad \text{Equation 3}$$

$$m_{j,i}^v = \sum_{i' \in N(v_j)\setminus i} m_{i',j}^q + L_j^{ch} = L_j - m_{i,j}^q$$

Fifth, the LDPC decoder ends the decoding if a codeword $\hat{c}$ estimated by hard decision on a total sum of the LLRs of the respective check nodes satisfies $H\hat{c}^T=0$, and otherwise, repeats the message passing process. In this case, if $H\hat{c}^T=0$ is not satisfied even if the message passing process is repeated maximum repeating times, the LDPC decoder declares a decoding failure and terminates the decoding.

The BP decoding schemes other than the SPA include a min-sum algorithm (MSA). The MSA is an algorithm that reduces computational complexity by performing a minimum value comparison operation, as shown in Equation 4, instead of the tan h operation in the check node of the SPA (the third step of the SPA described above).

$$m_{i,j}^q = \prod_{j' \in N(c_i)\setminus j} \text{sgn}(m_{j',i}^v) \cdot \min_{j' \in N(c_i)\setminus j} |m_{j',i}^v| \qquad \text{Equation 4}$$

The MSA performs the simpler calculation process compared to the SPA but has a shortcoming in that decoding performance is degraded. In order to address this performance degradation issue, an offset MSA and a normalized MSA have been proposed.

The offset MSA calculates the message value of the check node as shown in Equation 5, and the normalized MSA calculates the message value of the check node as shown in Equation 6. The offset MSA and the normalized MSA can achieve performance that is close to that of the SPA by applying a correction value when comparing minimum values.

$$m_{i,j}^q = \prod_{j' \in N(c_i)\setminus j} \text{sgn}(m_{j',i}^v) \cdot \min_{j' \in N(c_i)\setminus j} |(m_{j',i}^v - \alpha, 0)| \qquad \text{Equation 5}$$

$$m_{i,j}^q = \alpha \prod_{j' \in N(c_i) \setminus j} \text{sgn}(m_{j',i}^v) \cdot \min_{j' \in N(c_i) \setminus j} |m_{j',i}^v| \quad \text{Equation 6}$$

In some embodiments, when the BP decoding fails or when a CRC check fails in a case that a CRC code is concatenated with an LDPC code, decoding may iteratively performed by changing a received symbols (bits) with low reliability until a valid codeword is found. A process of changing the received symbols is called perturbation. In the perturbation, a part or all of the received symbols may be added with an arbitrary noise, or may be substituted with a new signal value. Hereinafter, this decoding method is referred to as "multi-round BP decoding with perturbation" (MBPDP).

Figure 3:
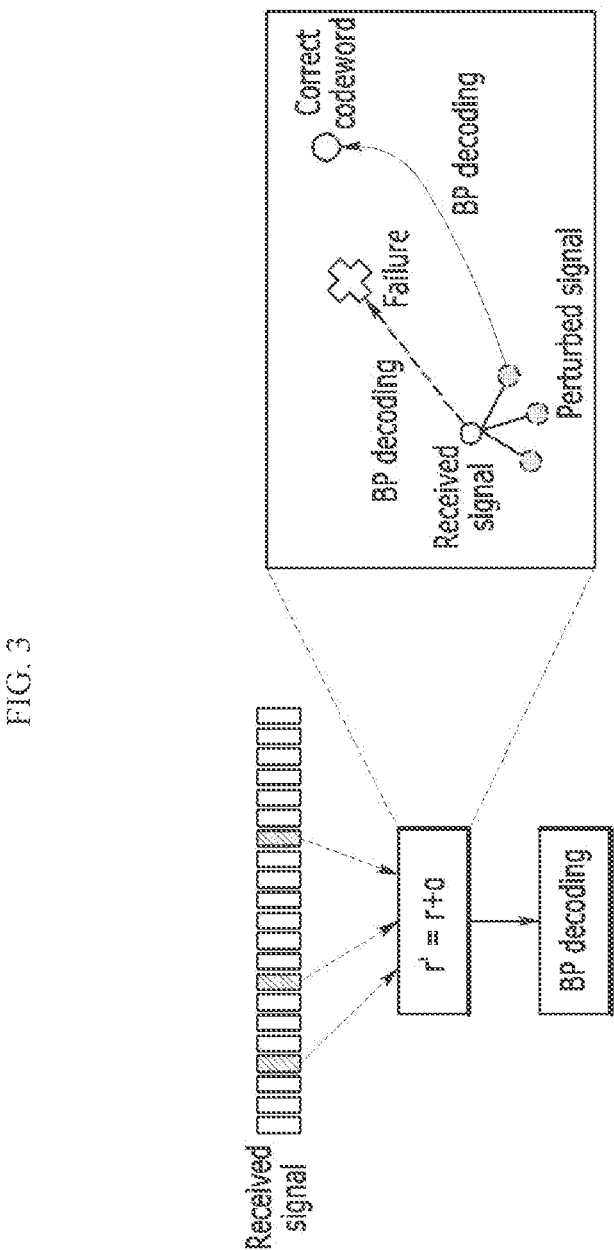
FIG. 3 is a diagram showing an effect of perturbation in BP decoding.
Figure 4:
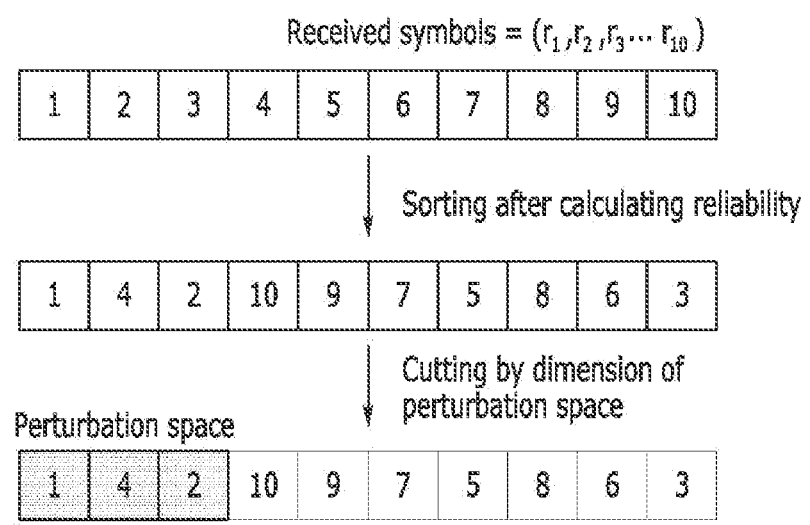
FIG. 4 is a diagram showing an example process of generating a perturbation space.
Figure 5:
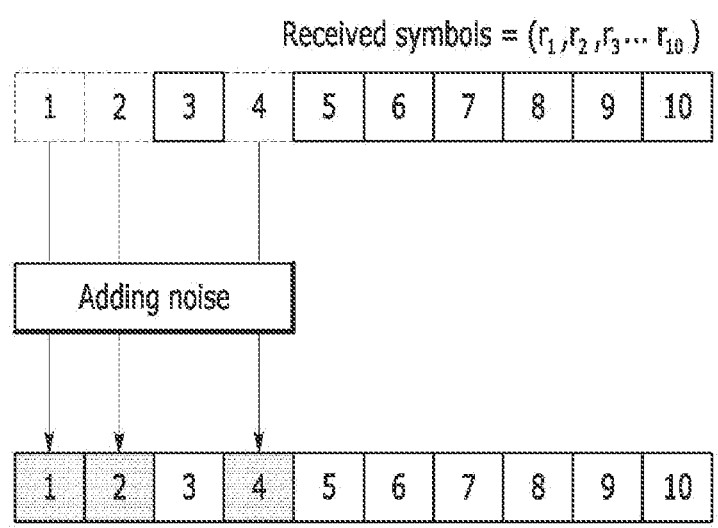
FIG. 5 is a diagram showing an example of a perturbation process.

FIG. 3 is a diagram showing an effect of perturbation in BP decoding, FIG. 4 is a diagram showing an example process of generating a perturbation space, and FIG. 5 is a diagram showing an example of a perturbation process. FIG. 4 and FIG. 5 show an example in which a dimension of the perturbation space is 3 and a length of a codeword (the number of received symbols) is 10.

As shown in FIG. 3, when BP decoding for a received signal r fails, a noise a is added to the received signal r so as to reach a valid codeword by changing a decoding start point. In this case, a CRC code may be used to determine the early termination of repeating processes by finding the valid codeword during a perturbation process. The perturbation may largely include three detailed operations of determining a perturbation space, generating a pattern, and modifying a signal. Determining the perturbation space and modifying the signal may have a great influence on each other, and the decoding performance and complexity may vary according to their operating methods. Therefore, it is important to determine an operating method of the perturbation for producing optimal performance.

The first step in the perturbation is to determine a perturbation space. Determining the perturbation space is a process of selecting a space to be modified by adding a noise to a received signal. As shown in FIG. 4, the perturbation space may be generated by sorting indices of received symbols (e.g., in the ascending order of reliability), and then cutting a set of sorted indices by a dimension $\tau$ of a predetermined space (perturbation space). Reliability of a symbol may be estimated by using an intrinsic LLR of the received signal or a result of a BP decoding process. The result of the decoding process may include, for example, a message magnitude/sign or a status of the number of unsatisfied check nodes constraint (nUC). In addition, the dimension of the perturbation space may be experimentally searched, or may be determined in consideration of a LDPC code structure, a type of noise, and a limited complexity of the decoder. The perturbation space may be determined when the first (initial) decoding fails, and the generated perturbation space may be maintained continuously during the perturbation, or may be updated at each perturbation iteration (round).

The second step in the perturbation is a process of generating a perturbation pattern. The perturbation pattern P refers to a set of symbol indices to modify a finite number of received symbols in the selected perturbation space. For example, in the perturbation pattern, when the perturbation space is (1,2,4) symbols and the signal is modified up to three symbols, the perturbation patterns that can be generated include {{11}, {2}, {4}, {1,2}, {1,4}, {2,4}, {1,2,4}}.

The last step in the perturbation is a process of modifying the received signal by using the perturbation space and perturbation pattern generated previously as shown in FIG. 5. The signal modification is to add various types of noise to symbols belonging to the perturbation space and perturbation pattern, and symbols that do not belong to the perturbation space have the same value as the received signal. The modified signal is re-decoded by calculating the LLR again.

In the MBPDP decoding scheme, there are various schemes depending on how the reliability of the received signal is calculated and the signal is modified during the perturbation. Hereinafter, afterburner and Gaussian perturbation schemes, which are representative schemes of the MBPDP, are described with reference to FIG. 6.

Figure 6:
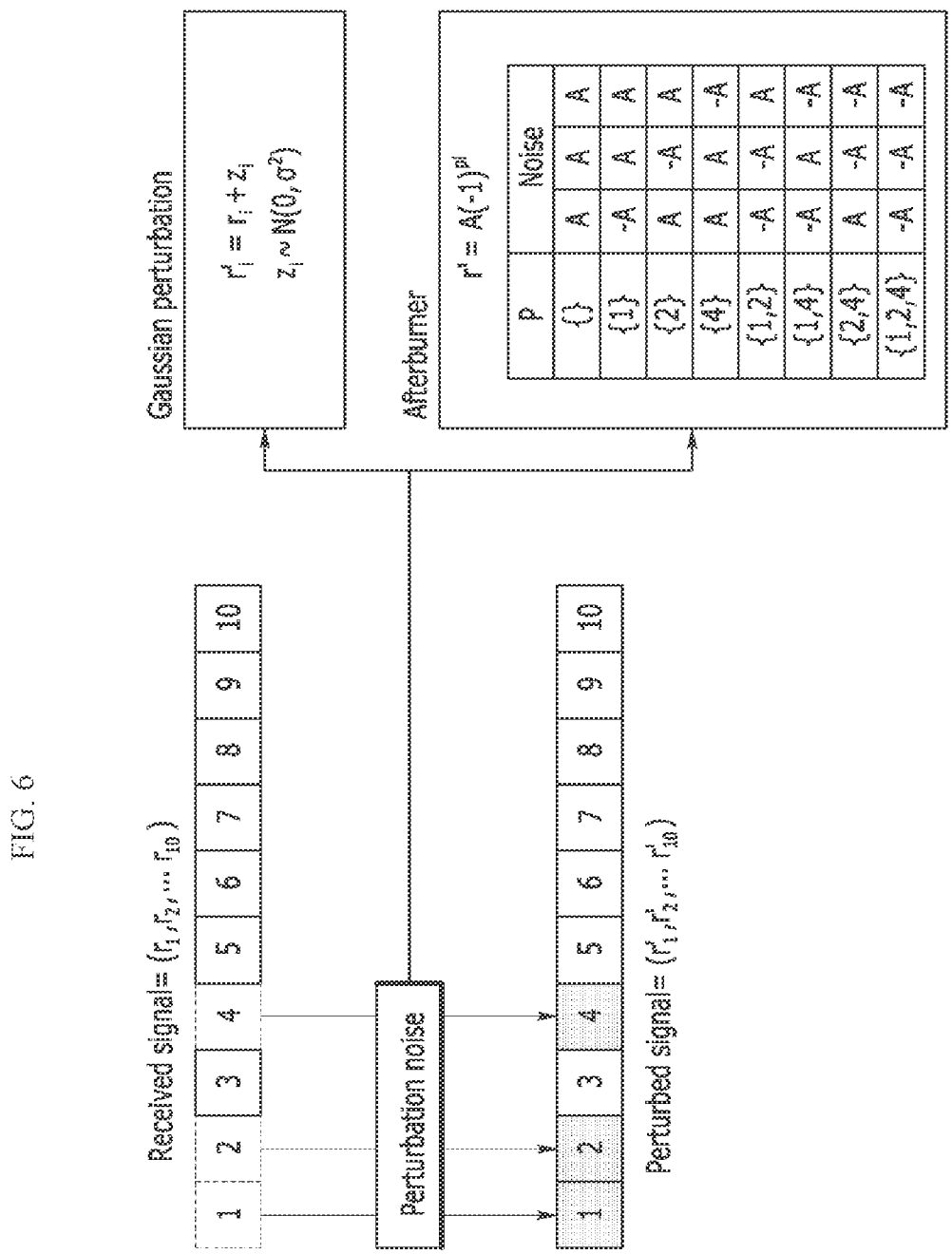
FIG. 6 is a diagram showing an example of a signal modification process according to perturbation patterns of a Gaussian decoder and an afterburner decoder.

FIG. 6 is a diagram showing an example of a signal modification process according to perturbation patterns of a Gaussian perturbation decoder and an afterburner decoder. FIG. 6 shows an example in which a dimension of a perturbation space is 3.

A Gaussian perturbation scheme is to add, as perturbation noise, a Gaussian noise $z_i = N(0, \sigma^2)$ to symbols (bits) $r_i$ included in a selected perturbation space (e.g., (1,2,4) symbols) as shown in FIG. 6. In this case, another noise such as binary noise may be used instead of the Gaussian noise, and a pattern generated irregularly may be used while iterations are performed up to a maximum number T of perturbation rounds. In addition, a space to which the perturbation noise is added may be determined after calculating the reliability by using whether syndrome is satisfied and a magnitude of an intrinsic LLR in the first BP decoding process of the LDPC code, and may be updated for each perturbation round. In the Gaussian perturbation, the maximum number of rounds may be flexibly determined, but in general, when the number of iterations is small, the performance is not excellent compared to other MBPDP schemes.

As shown in FIG. 6, the afterburner scheme is to generate a noise in accordance with a defined perturbation pattern and to add the noise to a perturbation space (e.g., {{1}, {2}, {4}, {1,2}, {1,4}, {2,4}, {1,2,4}}) generated by using only the magnitude of the intrinsic LLR, differently from the Gaussian perturbation scheme. Like the Gaussian perturbation scheme, a new perturbation space is not generated for each perturbation round. In the afterburner decoder, a pattern of perturbation noise generates $2^\tau$ tuple patterns for the dimension of the perturbation space. A noise with a fixed amplitude A and a negative sign may be generated and added to symbols belonging to the pattern in the perturbation space, and a noise with a positive sign may be may be generated and added to other symbols.

The Gaussian perturbation decoder has a shortcoming of higher complexity compared to the afterburner scheme. This is because the Gaussian perturbation decoder generates an arbitrary noise every time so that it requires additional complexity in implementation compared to the afterburner decoder that generates a noise according to a predefined rule. Further, the perturbation space is updated for each perturbation iteration (round) to obtain excellent performance, resulting in additional complexity. Furthermore, in hardware implementation, there is a shortcoming in that the perturbation decoders cannot be implemented in parallel because the perturbation space is updated every decoding time.

The afterburner decoding scheme has a lower computational complexity than the Gaussian perturbation decoder, and has the advantage in which decoders can be implemented in parallel when implemented in hardware. However, there is a shortcoming in that the decoding performance is not superior to the Gaussian perturbation scheme.

Further, since the size of the perturbation pattern $2^\tau$ is determined according to the dimension of the perturbation space $\tau$, there is a limitation in flexibly determining the maximum number of perturbation iterations.

In the both schemes, since the number of perturbation iterations performed to obtain a high decoding performance gain compared to the BP decoding is still large, it is necessary to develop a scheme that can reduce the number of decoding iterations (i.e., computation complexity) without deteriorating performance.

Next, an LDPC decoding method according to some embodiments is described with reference to FIG. 7 to FIG. 11.

In some embodiments, an MBPDP method to which flip perturbation is applied may be used as a perturbation scheme. Hereinafter, for convenience of description, the MBPDP to which the flip-perturbation is applied is referred to as "multi-round BP decoding with flip perturbation" (MBPFPD).

In the existing perturbation schemes, a decoding start point is changed by intensively adding a noise to a perturbation space having a relatively small dimension compared to a code length, or simultaneously adding a plurality of noises to a wide perturbation space. That is, the received signal is intensively modified only in a specific space to search for a valid codeword.

A perturbation scheme (flip perturbation scheme) according to some embodiments may add a noise by selecting a small number of symbols from a perturbation space that is relatively wider than that of the exiting schemes. The flip perturbation scheme may change a decoding start point of a received signal by slightly modifying a space as wide as possible instead of a specific space in the received signal. In some embodiments, the signal modification method may be a method of inserting a noise with maximum amplitude in a direction opposite to an LLR sign of the selected symbol. In some embodiments, the flip perturbation scheme may perform signal modification as shown in Equation 7. A received symbol corresponding to a perturbation pattern may be modified by inserting a noise with amplitude of A in a direction opposite to the selected symbol. In this case, A may mean a maximum value that can be set by a device that performs the flip perturbation scheme. When the maximum number of perturbation rounds T is given, the signal perturbed in the t-th iteration is represented as $r^{(t)} = (r_1^{(t)}, r_2^{(t)}, \ldots, r_n^{(t)})$.

$$r_i^{(t)} = \begin{cases} -\text{sgn}(r_i)A, & i \in P^t \\ r_i, & \text{otherwise} \end{cases} \quad \text{Equation 7}$$

Figure 7:
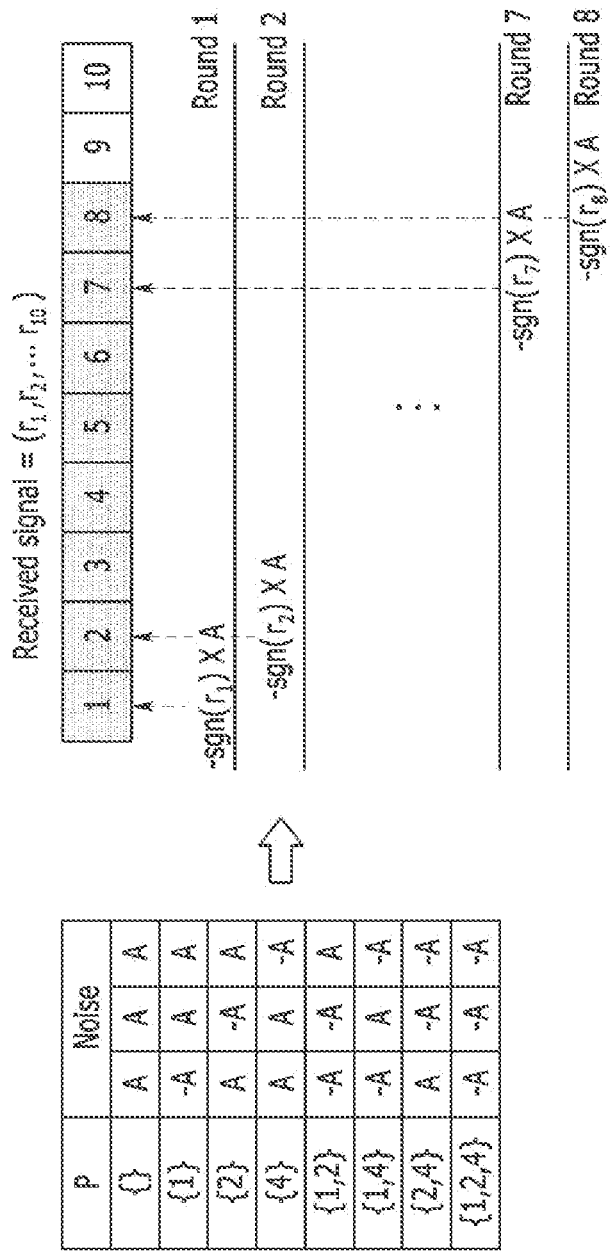
FIG. 7 is a diagram showing an example of a perturbation scheme according to some embodiments.

FIG. 7 is a diagram showing an example of a perturbation scheme according to some embodiments. FIG. 7 shows an example which is compared with an afterburner decoder when the maximum number of perturbation rounds T is 8. As in the example shown in FIG. 7, unlike the afterburner scheme adding noises of different patterns to three symbols, the flip perturbation scheme may add a noise to one symbol in turn for a total of eight symbols.

In some embodiments, when the maximum number of perturbation rounds T is given and is less than or equal to a code length n of a received signal, the flip perturbation scheme may basically set the number of symbols to which a noise to be applied at one time to one (1), and may set the dimension of the perturbation space $\tau$ to be equal to T.

In some embodiments, when the maximum number of perturbation rounds T is greater than the code length n, the dimension of the perturbation space may be first set to n, and perturbation with s=1 may be performed. Next, perturbation of s=2 may be performed remaining (T−n) times. That is, the perturbation may be performed on a combination of two symbols. If the total number of perturbation rounds performed after the perturbation with s=2 is performed is less than the maximum number of perturbation rounds T, the perturbation with s=3 may be performed for the remaining perturbation. Similarly, when the total number of perturbation rounds performed is less than the maximum number of perturbation rounds T, the perturbation may be performed while increasing the number of symbols s by one. In some embodiments, for the perturbation rounds with the same number of symbols, a perturbation pattern may be generated by preferentially selecting a bit with the lower reliability.

For example, assuming that the reliability $\lambda$ of the received symbol $r = (r_1, r_2, r_3, r_4)$ is $\lambda_4 < \lambda_1 < \lambda_2 < \lambda_3$ in an LDPC codeword with a code length of 4, the perturbation pattern P may be generated according to the value of the maximum number of perturbation rounds T as shown in Table 1. A noise may be added sequentially from the beginning in accordance with the generated perturbation pattern. That is, in each perturbation round, the perturbation corresponding to an index of the perturbation round may be performed. In Table 1, each element of the perturbation pattern P indicates an index of a symbol to be perturbed.

TABLE 1

| Maximum number of perturbation rounds T | Maximum number of symbols to be perturbed s | Perturbation pattern P |
| --- | --- | --- |
| 1 | 1 | {(4)} |
| 2 | 1 | {(4), (1)} |
| 3 | 1 | {(4), (1), (2)} |
| 4 | 1 | {(4), (1), (2), (3)} |
| 5 | 2 | {(4), (1), (2), (3), (4, 1)} |
| 6 | 2 | {(4), (1), (2), (3), (4, 1), (4, 2)} |
| 7 | 2 | {(4), (1), (2), (3), (4, 1), (4, 2), (4, 3)} |
| 8 | 2 | {(4), (1), (2), (3), (4, 1), (4, 2), (4, 3), (1, 2)} |
| 9 | 2 | {(4), (1), (2), (3), (4, 1), (4, 2), (4, 3), (1, 2), (1, 3)} |
| 10 | 2 | {(4), (1), (2), (3), (4, 1), (4, 2), (4, 3), (1, 2), (1, 3), (2, 3)} |
| 11 | 3 | {(4), (1), (2), (3), (4, 1), (4, 2), (4, 3), (1, 2), (1, 3), (2, 3), (4, 1, 2)} |
| 12 | 3 | {(4), (1), (2), (3), (4, 1), (4, 2), (4, 3), (1, 2), (1, 3), (2, 3), (4, 1, 2), (4, 1, 3)} |

TABLE 1-continued

| Maximum number of perturbation rounds T | Maximum number of symbols to be perturbed s | Perturbation pattern P |
| --- | --- | --- |
| 13 | 3 | {(4), (1), (2), (3), (4, 1), (4, 2), (4, 3), (1, 2), (1, 3), (2, 3), (4, 1, 2), (4, 1, 3), (4, 2, 3)} |
| 14 | 3 | {(4), (1), (2), (3), (4, 1), (4, 2), (4, 3), (1, 2), (1, 3), (2, 3), (4, 1, 2), (4, 1, 3), (4, 2, 3), (1, 2, 3)} |
| 15 | 4 | {(4), (1), (2), (3), (4, 1), (4, 2), (4, 3), (1, 2), (1, 3), (2, 3), (4, 1, 2), (4, 1, 3), (4, 2, 3), (1, 2, 3), (4, 1, 2, 3)} |

Figure 8:
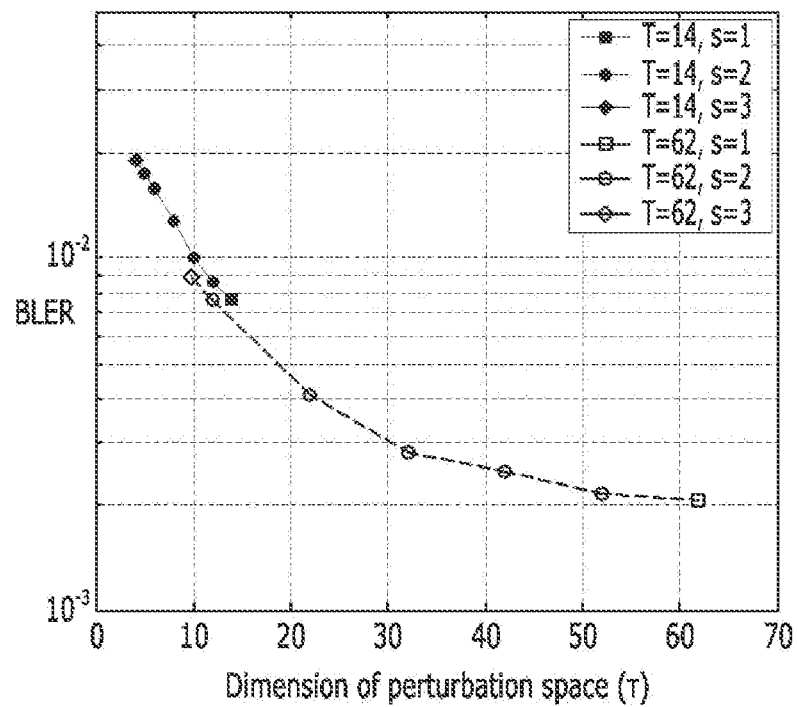
FIG. 8 is a diagram showing an example of decoding performance comparison depending on a dimension of a perturbation space.

FIG. 8 is a diagram showing an example of decoding performance comparison depending on a dimension of a perturbation space. In FIG. 8, energy per bit ($E_b$) to noise power spectral density ($N_0$) ratio $E_b/N_0$ is 4.0 dB, and a horizontal axis represents a dimension of a perturbation space and a vertical axis represents a BLER.

As shown in FIG. 8, it can be seen that the decoding performance is best when the dimension of the perturbation space is the maximum (located on the far right), and the decoding performance decreases as the dimension of the perturbation space decreases. Accordingly, in some embodiments, the decoding performance can be improved by setting the dimension of the perturbation space to the maximum.

In some embodiments, the flip perturbation scheme may generate a perturbation space by estimating the reliability of the received symbols and sorting indices of the received symbols in the ascending order of reliability.

In the existing perturbation schemes, it is determined that the reliability is decreased as the magnitude of the intrinsic LLR decrease or nUC when BP decoding fails increases. In addition, it is determined that the reliability is decreased as the number of sign changes of variable nodes (nSCV) transmitted through the connection lines during the BP decoding increases.

In contrast, in some embodiments, the flip perturbation scheme may use, as a reliability calculation method, a method of calculating the nSMV by comparing a sign of posterior LLR and a sign of extrinsic LLR during the BP decoding. In some embodiments, the flip perturbation scheme may calculate the number of mismatches $m_j$ between the sign of the posterior LLR $l^i(j)$ and the sign of the extrinsic LLR $l^i(j) - l^0(j)$ of the j-th symbol in the i-th iteration as in Equation 8.

$$m_j = |\{i | l^i(j)(l^i(j) - l^0(j)) < 0, 1 \leq i \leq I_{max}\}|$$ Equation 8

In the flip perturbation scheme, symbols with more sign mismatches may be determined less reliable. When two symbols have the same number of sign mismatches, the flip perturbation scheme may determine that the reliability of the symbol with the smaller magnitude is lower by comparing the magnitudes of the intrinsic LLRs.

Figure 9:
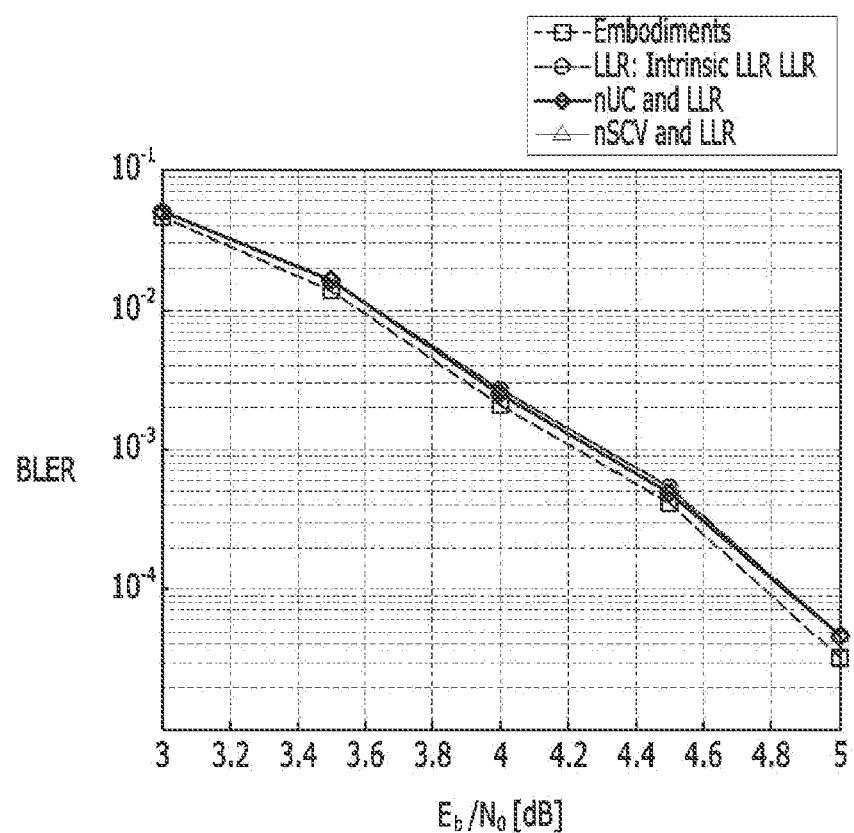
FIG. 9 is a diagram showing an example of performance comparison between a reliability calculation method according to some embodiments and an existing reliability calculation method.

FIG. 9 is a diagram showing an example of performance comparison between a reliability calculation method according to some embodiments and an existing reliability calculation method. As the existing reliability calculation method, the message magnitude/sign or the syndrome check (whether the check node constraint is satisfied) is used. A code size of an LDPC code used in FIG. 9 is (96, 48), a horizontal axis represents energy per bit to noise power spectral density ratio $E_b/N_0$, and a vertical axis represents a BLER.

As shown in FIG. 9, it can be seen that the reliability calculation method (nSMV) according to some embodiments generates a gain of about 0.1 dB at BLER=$10^{-3}$, and achieves the decoding performance superior to other reliability calculation methods (a method using only a magnitude of LLR, a method using both nUC and the magnitude of LLR, and a method using both nSCV and the magnitude of LLR). In the BP decoding process, additional complexity may occur due to the sign comparison and the sorting. In this case, the nSMV calculation method may not be used due to the complexity constraint. In some other embodiments, the reliability may be calculated by using only the magnitude of the LLR. As shown in FIG. 9, when only the magnitude of the LLR is used, the performance may degrade compared to the nSMV reliability calculation method, but there is little difference in the performance from other reliability calculation methods, so that the decoder can be efficiently operated.

Next, an LDPC decoding method and an LDPC decoding apparatus according to embodiments are described with reference to FIG. 10 to FIG. 13.

Figure 10:
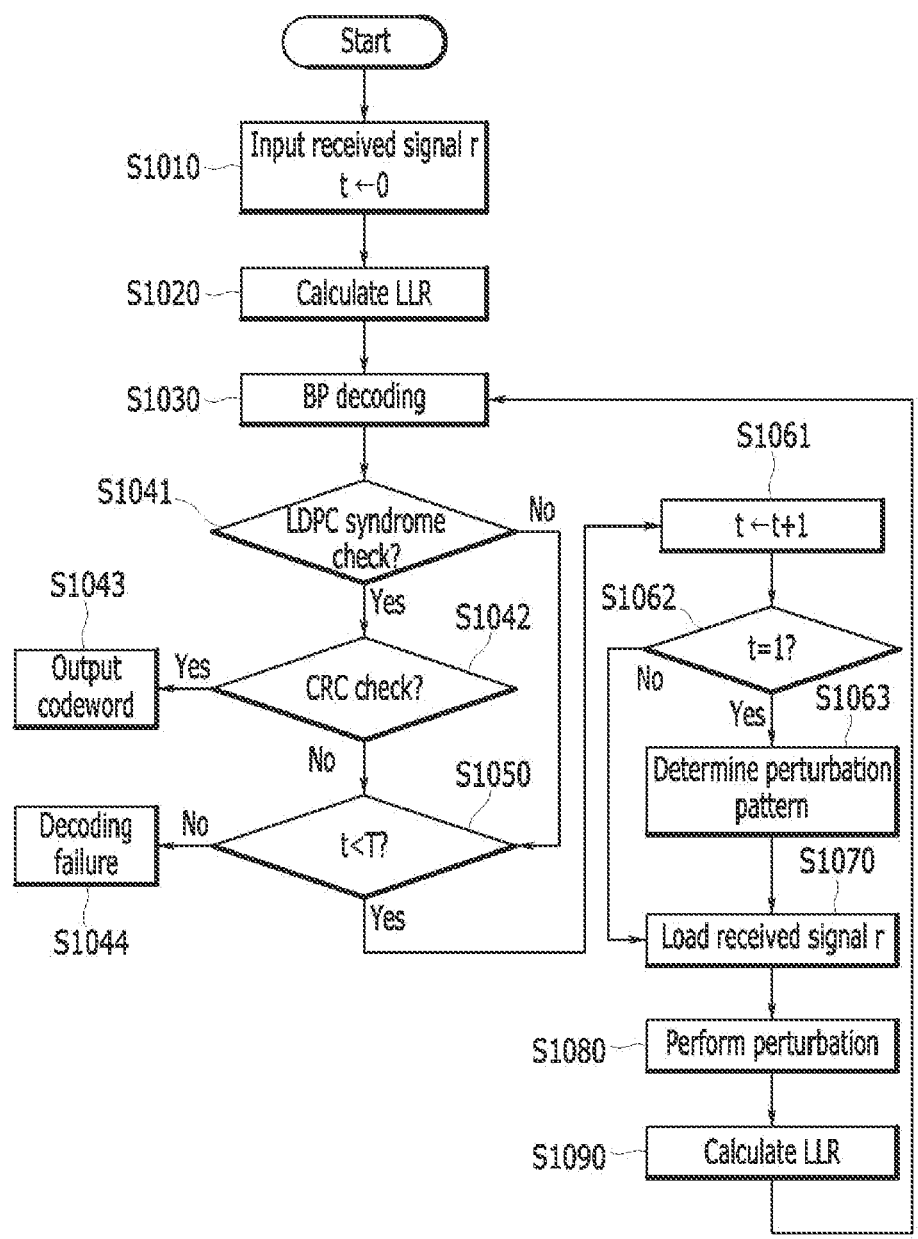
FIG. 10 is a flowchart showing an example of an LDPC decoding method according to some embodiments.

FIG. 10 is a flowchart showing an example of an LDPC decoding method according to some embodiments.

Referring to FIG. 10, a decoding apparatus attempts decoding again by applying a flip perturbation scheme when failing to decode a received signal $r = (r_1, r_2, \ldots, r_n)$.

First, the decoding apparatus receives the received signal $r = (r_1, r_2, \ldots, r_n)$ at step S1010, and calculates a message value for decoding from the received signal r at step S1020. In some embodiments, the decoding apparatus may calculate the message value as an LLR $l^{ch} = (l_1^{ch}, l_2^{ch}, \ldots, l_n^{ch})$ as in Equation 1 described above. Since the decoding apparatus is going to perform the decoding without applying the flip perturbation scheme, the decoding apparatus may initialize the number of perturbation rounds t, i.e., a perturbation round parameter t to zero at step S1010. In addition, the decoding apparatus may copy the received signal r at step S1010 so that the received signal r to which the perturbation has not been performed can be used.

Next, the decoding apparatus decodes the received signal r based on the message value (e.g., the LLR) at step S1030. In some embodiments, the decoding apparatus may perform BP decoding. For the BP decoding, an MSA, an SPA, or modifications thereof (e.g., an offset MSA or a normalized MSA), or the like may be used.

The decoding apparatus determines whether the decoding is successful based on a codeword $\hat{c}$ estimated through the decoding at steps S1041 and S1042. In some embodiments, the decoding apparatus may first determine whether the decoding is successful based on the codeword $\hat{c}$ at step S1041. In some embodiments, at step S1041, the decoding apparatus may determine whether the LDPC syndrome satisfies a predetermined condition after the BP decoding. For example, the decoding apparatus may determine whether the syndrome $H\hat{c}^T$ is zero at step S1041. When the LDPC syndrome check is satisfied (i.e., passed) ($H\hat{c}^T = 0$), the decoding apparatus may check the CRC of the estimated codeword ĉ at step S1042. When the CRC check is satisfied (i.e., passed), the decoding apparatus may determine that the decoding is successful and output the estimated codeword ĉ at step S1043. When the CRC check is not satisfied (that is, when the decoding fails), the decoding apparatus may select a perturbation space and perform the decoding again by applying the flip perturbation scheme to the perturbation space. Further, when the decoding fails again, the decoding apparatus may perform the decoding up to the maximum number of perturbation rounds T while increasing the number of perturbation rounds. See steps S1050 to S1090.

In some embodiments, the decoding apparatus may select a perturbation space and determine a perturbation pattern in the first (beginning) perturbation round (i.e., t=1). See steps S1061, S1062, and S1063.

In some embodiments, when the maximum number of perturbation rounds T is given, in each perturbation round, the decoding apparatus may generate a perturbation pattern for performing flip perturbation on s symbols corresponding to the perturbation round at step S1063. In some embodiments, when the maximum number of perturbation rounds T is less than the code length n of the received signal, that is, the number of received symbols, the dimension of the perturbation space τ may be set equal to the maximum number of perturbation rounds T. In this case, the decoding apparatus may generate a perturbation pattern for executing n perturbation rounds by performing the flip perturbation on one corresponding symbol in each perturbation round. In some embodiments, when the maximum number of perturbation rounds T is greater than the code length n of the received signal, the decoding apparatus may set the dimension of the perturbation space τ to be equal to the code length n. In this case, at step S1063, the decoding apparatus may generate a perturbation pattern for executing n perturbation rounds by performing the flip perturbation on one corresponding symbol in each perturbation round. When the unexecuted perturbation round remains (i.e., when T perturbation rounds have been not executed), at step S1063, the decoding apparatus may generate a perturbation pattern for executing operations of increasing the number of symbols s by one and performing the flip perturbation on the s corresponding symbols in each perturbation round, up to the maximum number of perturbation rounds T. In some embodiments, the decoding apparatus may generate a perturbation pattern such that perturbation is performed in the ascending order of reliability from the symbol with the lowest reliability at step S1063.

In each perturbation round, the decoding apparatus loads the received signal r at step S1070, and generates a signal $r^{(t)}$ perturbed in the t-th perturbation round by applying the perturbation pattern to the received signal at step S1080. Next, the decoding apparatus calculates a message value for decoding from the perturbed signal r(t) at step S1090. In some embodiments, the decoding apparatus may calculate the message value as the LLR $l'=(l_1', l_2', \ldots, l_n')$ as in Equation 9.

Equation 9

$$l' = \frac{2r'}{\sigma^2}$$

Next, the decoding apparatus may determine whether the decoding is successful by applying the message value calculated in step S1090 as a message value to be used when decoding the received signal r. In some embodiments, as described in steps S1030 to S1043, the decoding apparatus may decode the received signal r based on the message value l' at step S1030. The decoding apparatus may determine whether the decoding is successful based on the codeword ĉ estimated through the decoding at steps S1041 and S1042. In some embodiments, the decoding apparatus may first determine whether the decoding is successful based on the codeword ĉ at step S1041. In some embodiments, at step S1041, the decoding apparatus may determine whether the LDPC syndrome satisfies a predetermined condition after the BP decoding. For example, the decoding apparatus may determine whether the syndrome $Hĉ^T$ is zero at step S1041. When the LDPC syndrome satisfies the predetermined condition ($Hĉ^T=0$), the decoding apparatus may check the CRC of the estimated codeword ĉ at step S1042. When the CRC check is passed, the decoding apparatus may determine that the decoding is successful and output the estimated codeword ĉ at step S1043. If the CRC check is not passed, when the number of perturbation rounds t does not exceed the maximum number of perturbation rounds T at step S1050, the decoding apparatus may increase the number of perturbation rounds t by one at step S1061 and then perform the decoding again at steps S1070 to S1090.

When the decoding is not successful even after repeating the flip perturbation up to the maximum number of perturbation rounds T at step S1050, the decoding apparatus may determine that the decoding is failed at step S1044.

Figure 11:
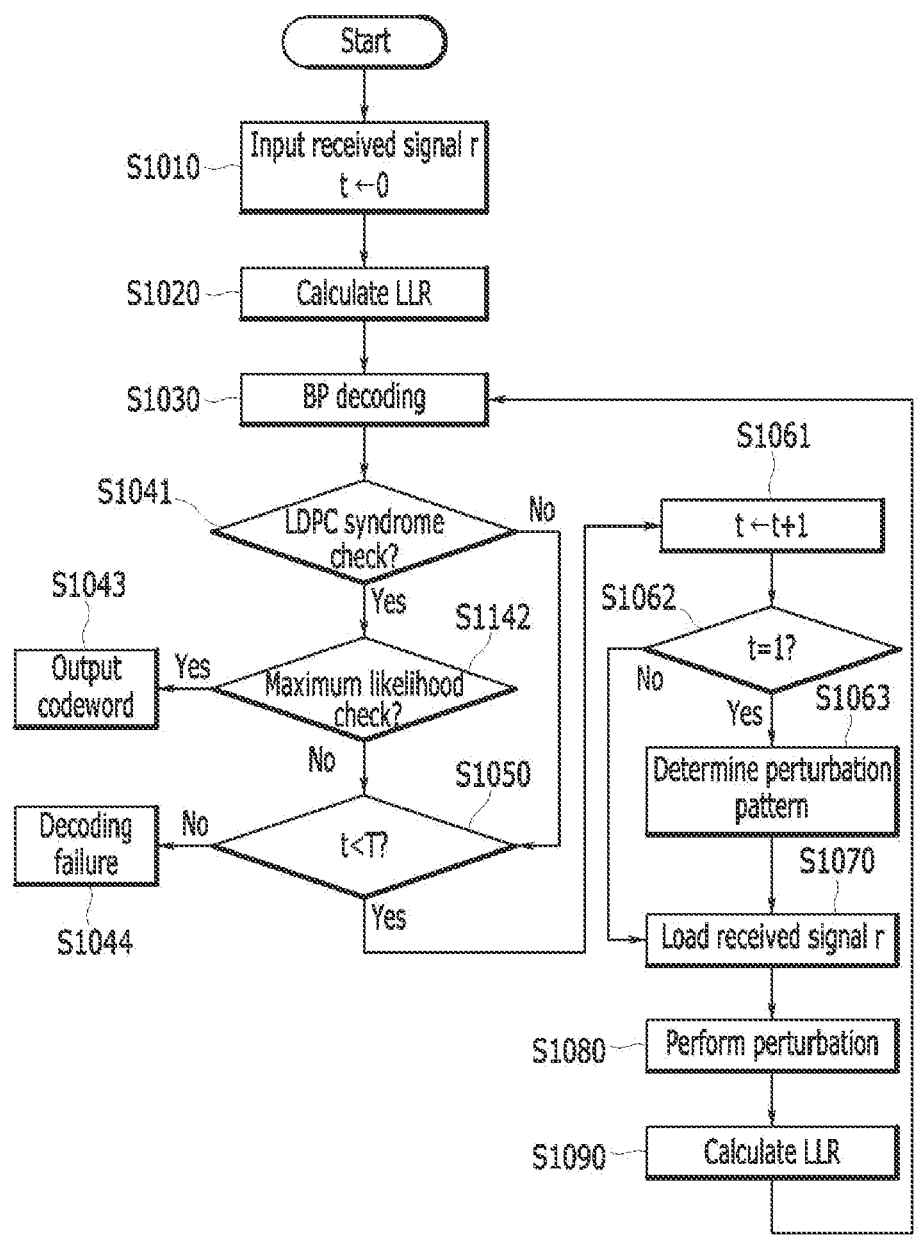
FIG. 11 is a flowchart showing an example of an LDPC decoding method according to some other embodiments.

FIG. 11 is a flowchart showing an example of an LDPC decoding method according to some other embodiments.

Referring to FIG. 11, unlike embodiments described with reference to FIG. 10, the decoding apparatus may not perform the CRC check. In some embodiments, when a CRC code is not concatenated with the LDPC code, the decoding apparatus may check a maximum likelihood instead of the CRC check at step S1142. In some embodiments, the decoding apparatus may perform the maximum likelihood check by comparing a maximum likelihood calculated in the decoding with a known maximum likelihood at step S1142. When the maximum likelihood check is passed, the decoding apparatus may determine that the decoding is successful and output the estimated codeword ĉ at step S1043. When the maximum likelihood check is not passed, the decoding apparatus may perform decoding again by applying the flip perturbation scheme, and may perform the decoding up to the maximum number of perturbation rounds T when the decoding fails. See steps S1050 to S1090.

Figure 12:
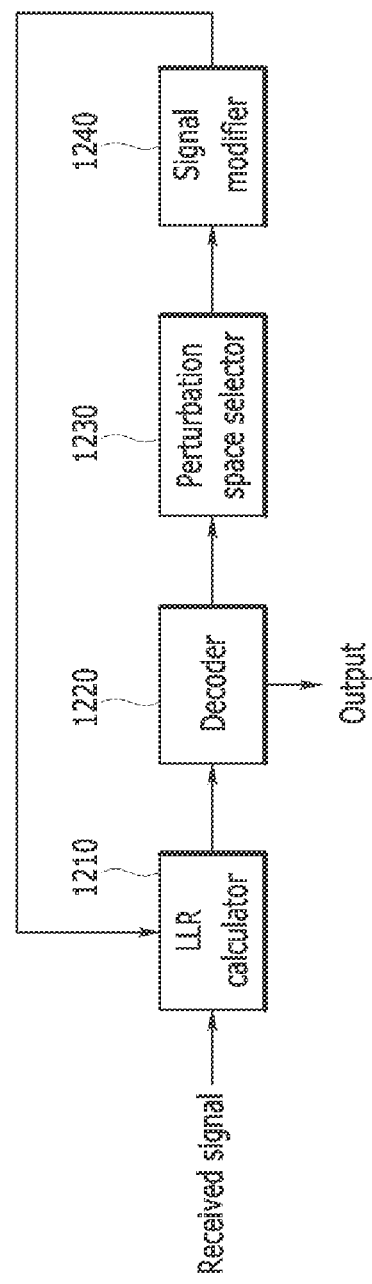
FIG. 12 is a block diagram showing an example of an LDPC decoding apparatus according to some embodiments.
Figure 13:
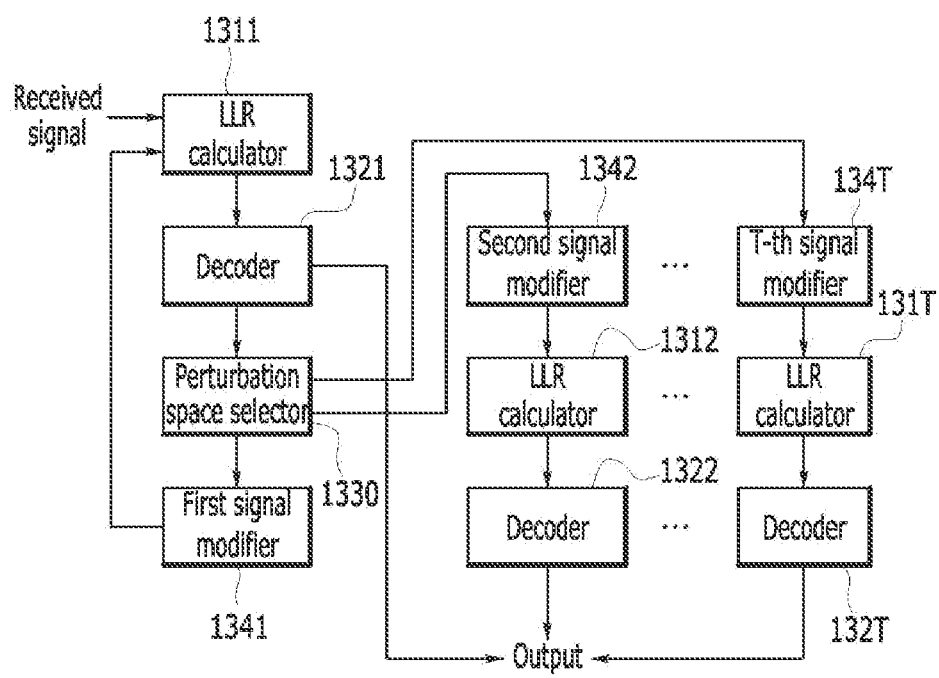
FIG. 13 is a block diagram showing an example of an LDPC decoding apparatus according to some other embodiments.

FIG. 12 is a block diagram showing an example of an LDPC decoding apparatus according to some embodiments, and FIG. 13 is a block diagram showing an example of an LDPC decoding apparatus according to some other embodiments.

Referring to FIG. 12, an LDPC decoding apparatus includes an LLR calculator unit 1210, a decoder 1220, a perturbation space selector 1230, and a signal modifier 1240.

The LLR calculator 1210 calculates an LLR from a received signal. The decoder 1220 decodes the received signal based on the LLR calculated by the LLR calculator 1210, and determines whether the decoding is successful. When the decoding is not successful, the perturbation space selector 1230 selects a perturbation space to which a flip perturbation scheme is applied, and generates a perturbation pattern to be applied to the perturbation space. The signal modifier 1240 performs perturbation on a corresponding received symbol according to a corresponding element of the perturbation pattern in each perturbation round, and transfers the perturbed received signal to the LLR calculator 1210.

Next, the LLR calculator 1210 calculates the LLR from the perturbed received signal received from the signal modifier 1240. The decoder 1220 decodes the received signal based on the LLR calculated by the LLR calculator 1210, and determines whether the decoding is successful again. When the decoding is not successful again, the perturbation space selector 1230 and the signal modifier 1240 perform the next perturbation round.

If the number of perturbation rounds does not exceed the maximum number of perturbation rounds, the LDPC decoding apparatus sequentially performs the next perturbation rounds until the decoding is successful. As described above, the LDPC decoding apparatus may perform a plurality of perturbation rounds in series. In some embodiments, the LDPC decoding apparatus may perform the perturbation rounds in the ascending order of the number of symbols to which the perturbation is applied. In the same number of symbols to which the perturbation is applied, the LDPC decoding apparatus may perform perturbation rounds in the ascending order of reliability of symbols to which the perturbation is applied.

Referring to FIG. 13, an LDPC decoding apparatus includes a plurality of LLR calculators 1311 to 131T, a plurality of decoders 1321 to 132T, a perturbation space selector 1330, and a plurality of signal modifiers 1341 to 134T. In FIG. 13, the number of LLR calculators 1311 to 131T, the number of decoders 1321 to 132T, and the number of signal modifiers 1341 to 134T may be equal to the maximum number of perturbation rounds T.

The LLR calculator 1311 calculates an LLR from a received signal. The decoder 1321 decodes the received signal based on the LLR calculated by the LLR calculator 1311, and determines whether the decoding is successful. When the decoding is not successful, the perturbation space selector 1330 selects a perturbation space to which a flip perturbation scheme is applied, and generates a perturbation pattern to be applied to the perturbation space.

The plurality of signal modifiers 1341 to 134T perform the perturbation on the corresponding received symbols in parallel according to the corresponding elements of the perturbation pattern, and transfers the perturbed received signals to the corresponding LLR calculators 1311 to 131T. The plurality of LLR calculators 1311 to 131T calculate LLRs from the perturbed received signals received from the corresponding signal modifiers 1341 to 134T. The plurality of decoders 1321 to 132T decode the received signals based on the LLRs calculated by the corresponding LLR calculators 1311 to 131T, and determines whether the decoding is successful.

As described above, the LDPC decoding apparatus may perform the plurality of perturbation rounds in parallel. In some embodiments, when two or more decoding successes occur in decoding processes performed in parallel, the LDPC decoding apparatus may prioritize the decoding result of the perturbation round with a smaller number of symbols to which the perturbation is applied. In the same number of symbols to which the perturbation is applied, the LDPC decoding apparatus may prioritize the decoding result of the perturbation round with the lower reliability among the symbols to which the perturbation is applied.

In some embodiments, the LDPC decoding apparatus may not perform all perturbation rounds in parallel, group the plurality of perturbation rounds into a plurality of perturbation round groups, perform the plurality of perturbation round groups in series, and perform perturbation rounds included in each perturbation round group in parallel.

As described above, according to some embodiments, since a small number of noises with a fixed magnitude are generated and added, the implementation complexity can be relatively lower than a case of generating arbitrary noises. Further, additional computational complexity cannot occur because the perturbation space is not updated every perturbation round. Furthermore, since a noise is not generated in both directions, the complexity can be reduced in terms of noise implementation, and superior performance can be achieved compared to the existing schemes.

Figure 14:
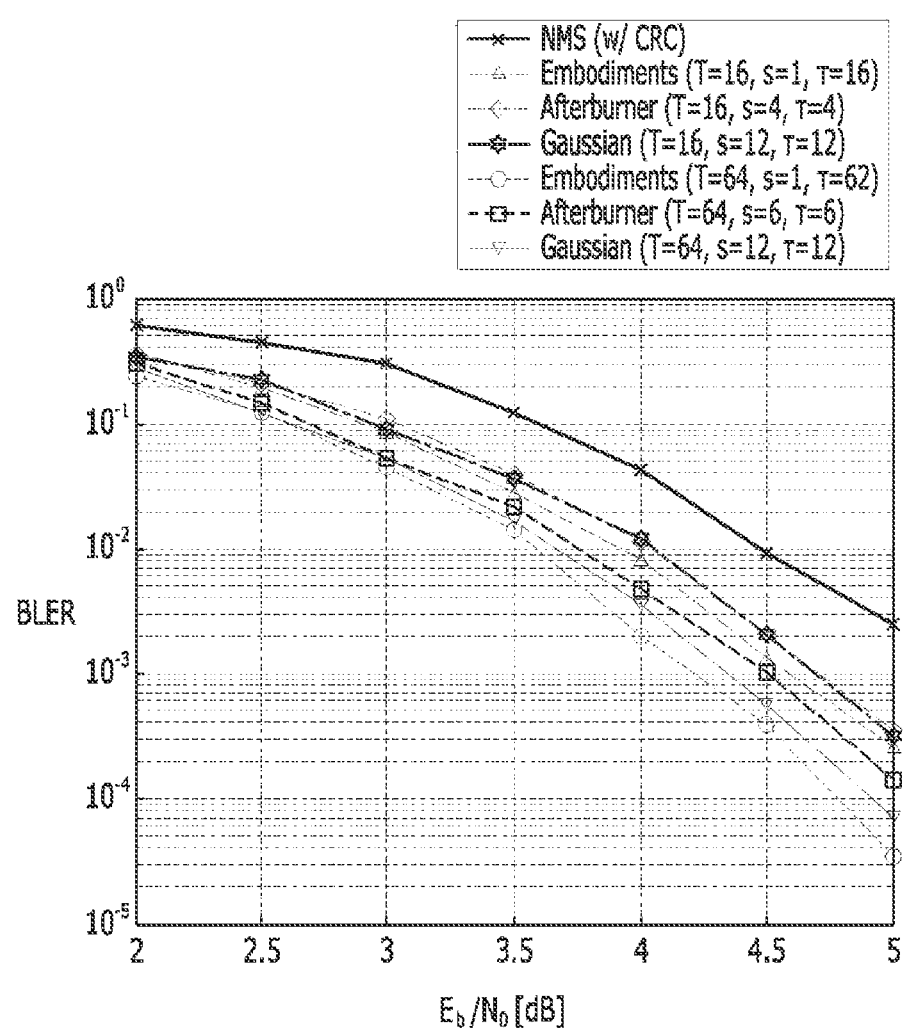
FIG. 14 is a diagram showing an example of decoding performance comparison depending on a perturbation scheme of an LDPC code.
Figure 15:
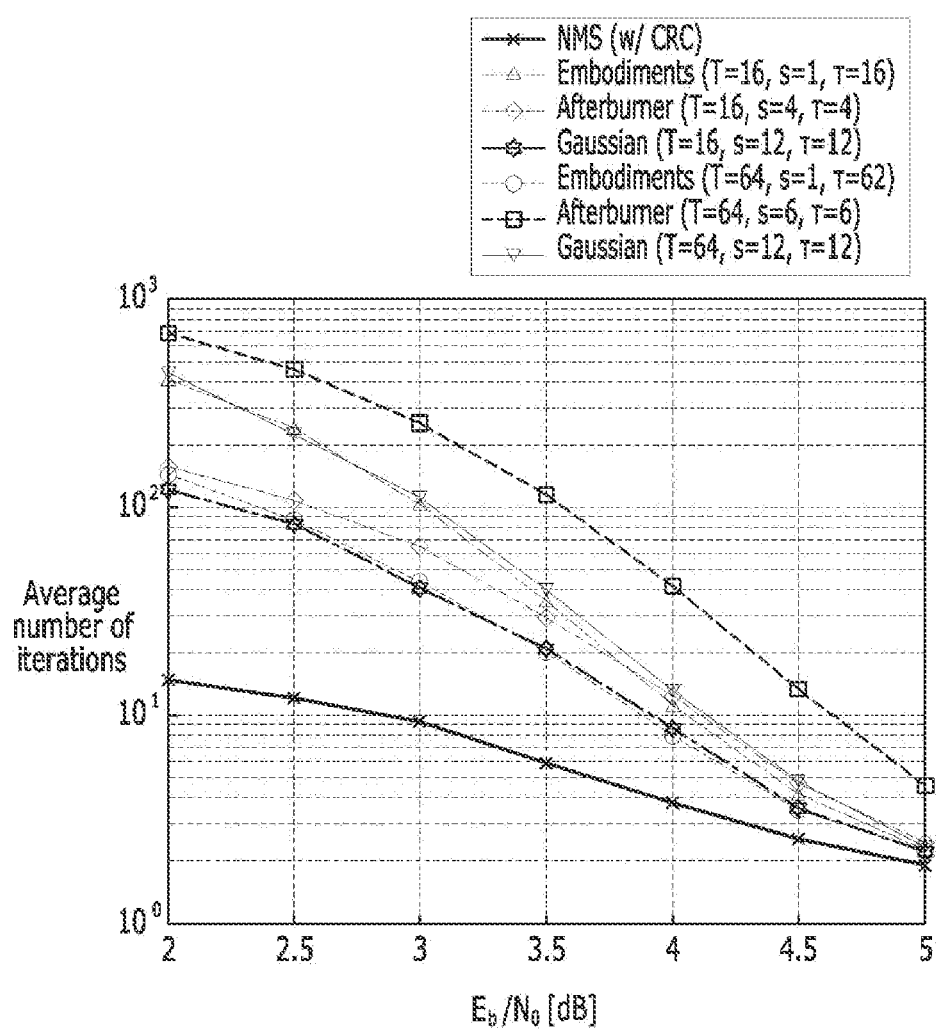
FIG. 15 is a diagram showing an example of comparison of the average number of decoding iterations depending on a perturbation scheme of an LDPC code.

Next, performance of an LDPC decoding method according to some embodiments is evaluated in comparison to the existing BP decoding schemes and the existing perturbation schemes (Gaussian perturbation scheme and afterburner scheme) with reference to FIG. 14 and FIG. 15. The performance comparison is performed by measuring the BLER performance and the average number of decoding performed until a valid codeword is searched. The average number of perturbations may roughly mean computational complexity.

For the evaluation, a (3,6)-regular LDPC code of size (96,48) is concatenated with an 8-bit CRC code. A code rate is calculated by reflecting the loss due to the CRC code. A normalized MSA (scaling factor=0.78) with a maximum number of iterations of 20 is applied for BP decoding, and a signal is transmitted by using BPSK modulation in the AWGN channel. In all perturbation schemes, the maximum number of perturbation rounds is set to 16 or 64. In a method of calculating reliability of a received symbol, nSMV and an intrinsic LLR are used in embodiments, nUC and an intrinsic LLR are used in the Gaussian perturbation scheme, and an intrinsic LLR is used in the afterburner scheme. In addition, a maximum value that can be implemented in the apparatus is used as an amplitude A of a noise to be applied when modifying a signal in embodiments and the afterburner scheme, and 30.0 is used in the evaluation. Table 2 shows parameters applied to simulation for the evaluation.

TABLE 2

| | Embodiments | Gaussian perturbation | Afterburner |
|---|---|---|---|
| | Perturbation space selection | | |
| | nSMV, intrinsic LLR | nUC, intrinsic LLR | Intrinsic LLR |
| | | A or $\sigma$ | |
| | A = 30 | $\sigma$ = 0.6 | A = 30 |
| T | 16   64 | 16   64 | 16   64 |
| s | 1    1 | 12   12 | 4    6 |
| $\tau$ | 16   64 | 12   12 | 4    6 |

FIG. 14 is a diagram showing an example of decoding performance comparison depending on a perturbation scheme of an LDPC code, and FIG. 15 is a diagram showing an example of comparison of the average number of decoding iteration depending on a perturbation scheme of an LDPC code. In FIG. 14 and FIG. 15, a horizontal axis represents energy per bit to noise power spectral density ratio $E_b/N_0$. A vertical axis in FIG. 14 represents a BLER, and a vertical axis in FIG. 15 represents the average number of decoding iterations (i.e. perturbation rounds).

As shown in FIG. 14, it can be seen that an LDPC decoding method according to some embodiments achieves the decoding performance better than the BP propagation decoding method (normalized MSA) that does not use the perturbation scheme. In addition, it can be seen that the LDPC decoding method according to some embodiments improves the performance compared to the existing perturbation schemes at the same maximum number of perturbation rounds T. Specifically, the LDPC decoding method according to some embodiments can achieve a performance gain of 0.7 dB for T=16 and 1.1 dB for T=64 at BLER $10^{-3}$ over the normalized MSA. Further, the LDPC decoding method according to some embodiments can achieve the performance gain of 0.5 dB for T=16 and 0.7 dB for T=64 at BLER $10^{-3}$ over the afterburner scheme, and can achieve the performance gain of 0.6 dB for T=16 and 0.8 dB for T=64 at BLER $10^{-3}$ over the Gaussian perturbation scheme.

As shown in FIG. 15, it can be seen that the average number of BP iterations (i.e., perturbation rounds) generally decreases as $E_b/N_0$ increases. At T=16, the LDPC decoding method according to some embodiments has the similar average number of perturbation rounds as the Gaussian perturbation scheme, and the average number of perturbation rounds in the afterburner scheme is the largest. At T=64, the LDPC decoding method according to some embodiments has the least number of perturbation rounds, and the afterburner scheme has the largest number of perturbation rounds.

As such, considering the decoding performance and the average number of perturbation rounds, it can be seen that the LDPC decoding method according to some embodiments has lower complexity and superior performance than the existing schemes.

As described above, according to some embodiments, when the MBPFPD is used, communication performance of high reliability while having lower complexity than the existing schemes can be achieved. In some embodiments, the MBPFPD can be applied to various communication scenarios requiring the high reliability when transmitting data with a short length. In some embodiments, in communication scenarios requiring additional low latency, the LDPC decoders may be implemented in parallel, and the perturbation scheme and the decoding may be performed on a received signal in parallel, thereby obtaining excellent performance. Accordingly, the receiver can efficiently perform high-reliability and low-latency communication using LDPC codes.

Hereinafter, an example computing device for implementing an LDPC decoding method and an LDPC decoding apparatus according to some embodiments are described with reference to FIG. 16.

Figure 16:
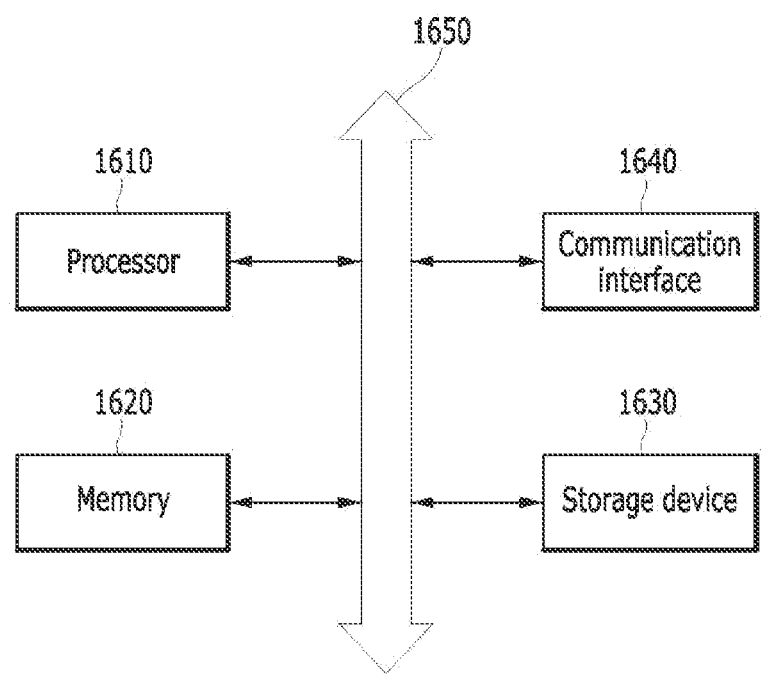
FIG. 16 is a drawing showing an example computing device according to some embodiments.

FIG. 16 is a drawing showing an example computing device according to some embodiments.

Referring to FIG. 16, a computing device 1600 includes a processor 1610, a memory 1620, a storage device 1630, a communication interface 1640, and a bus 1650. The computing device 1600 may further include other general components.

The processor 1610 control overall operation of each component of the computing device 1600. The processor 1610 may be implemented with at least one of various processing units such as a central processing unit (CPU), a microprocessor unit (MPU), a micro controller unit (MCU), and a graphic processing unit (GPU), or may be implemented with parallel processing units. In addition, the processor 1610 may perform operations on a program for executing the above-described LDPC decoding method.

The memory 1620 stores various data, commands, and/or information. The memory 1620 may load a computer program from the storage device 1630 to execute the above-described LDPC decoding method. The storage device 1630 may non-temporarily store the program. The storage device 1630 may be implemented as a nonvolatile memory.

The communication interface 1640 supports wireless communication of the computing device 1600.

The bus 1650 provides a communication function between components of the computing device 1600. The bus 1650 may be implemented as various types of buses such as an address bus, a data bus, and a control bus.

The computer program may include instructions that cause the processor 1610 to perform the LDPC decoding method when loaded into the memory 1620. That is, the processor 1610 may perform operations for the LDPC decoding method by executing the instructions.

The LDPC decoding method according to embodiments described above may be implemented as a computer-readable program on a computer-readable medium. In some embodiments, the computer-readable medium may include a removable recording medium or a fixed recording medium. In some embodiments, the computer-readable program recorded on the computer-readable medium may be transmitted to another computing device via a network such as the Internet and installed in another computing device, so that the computer program can be executed by another computing device.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. An LDPC decoding method of a received signal including a plurality of received symbols, the LDPC decoding method comprising:
    selecting a perturbation space in which perturbation is to be performed based on a code length of the received signal and a maximum number of perturbation rounds indicating a number of perturbation rounds that can be performed;
    performing at least one perturbation round;
    performing perturbation on a corresponding received symbol among the plurality of received symbols in each perturbation round;
    decoding the received signal on which the perturbation has been performed; and
    determining that decoding is successful when there is a perturbation round in which a decoding result of the received signal satisfies a predetermined condition among the at least one perturbation round,
    wherein the at least one perturbation round comprises a plurality of first perturbation rounds for performing the perturbation on a corresponding one symbol among the plurality of received symbols.

2. The LDPC decoding method of claim 1, wherein the selecting the perturbation space comprises setting a dimension of the perturbation space to be equal to the maximum number of perturbation rounds when the maximum number of perturbation rounds is less than or equal to the code length of the received signal.

3. The LDPC decoding method of claim 1, wherein the selecting the perturbation space comprises setting a dimension of the perturbation space to be equal to the code length of the received signal when the maximum number of perturbation rounds is greater than the code length of the received signal, wherein the at least one perturbation round further comprises at least one second perturbation round for performing the perturbation on corresponding s received symbols among the plurality of received symbols, and wherein s is an integer greater than one.

4. The LDPC decoding method of claim 1, wherein the performing the at least one perturbation round comprises, when the decoding result of the received signal does not satisfy the predetermined condition in one perturbation round, performing a next perturbation round.

5. The LDPC decoding method of claim 1, wherein the performing the at least one perturbation round comprises performing a plurality of perturbation rounds in parallel.

6. The LDPC decoding method of claim 1, wherein the perturbation comprises a process of flipping the corresponding received symbol and multiplying the flipped received symbol with a noise of a predetermined amplitude.

7. The LDPC decoding method of claim 1, further comprising generating a perturbation pattern for a plurality of perturbation rounds corresponding to the maximum number of perturbation rounds,
wherein the perturbation pattern indicates an index of the corresponding received symbol in each perturbation round,
wherein the plurality of perturbation rounds are prioritized in ascending order of a number of corresponding received symbols, and
wherein when the number of corresponding received symbols is same, the plurality of perturbation rounds are prioritized in ascending order of reliability of corresponding received symbols.

8. The LDPC decoding method of claim 1, wherein the decoding the received signal comprises decoding the received signal on which the perturbation has been performed using a belief propagation (BP) decoding scheme.

9. The LDPC decoding method of claim 8, further comprising:
calculating a number of sign mismatches of variable nodes (nSMV); and
when the number of sign mismatches in a first received symbol among the plurality of received symbols is greater than the number of sign mismatches in a second received symbol among the plurality of received symbols, determining that reliability of the first received symbol is lower than reliability of the second received symbol.

10. The LDPC decoding method of claim 1, wherein the decoding the received signal comprises:
calculating a log likelihood ratio of the received signal on which the perturbation has been performed; and
decoding the received signal on which the perturbation has not been performed based on the log likelihood ratio.

11. The LDPC decoding method of claim 10, wherein the predetermined condition comprises a condition in which an LDPC syndrome check according to the decoding result and a CRC check of a codeword according to the decoding result are passed.

12. The LDPC decoding method of claim 10, wherein the predetermined condition comprises a condition in which an LDPC syndrome check according to the decoding result and a maximum likelihood check according to the decoding result are passed.

13. An LDPC decoding apparatus of a received signal including a plurality of received symbols, the LDPC decoding apparatus comprising:
a memory that stores one or more instructions; and
a processor that by executing the one or more instructions:
selects a perturbation space in which perturbation is to be performed based on a code length of the received signal and a maximum number of perturbation rounds indicating a number of perturbation rounds that can be performed;
performs perturbation on a corresponding received symbol among the plurality of received symbols in each perturbation round;
decodes the received signal on which the perturbation has been performed in each perturbation round;
when a decoding result of the received signal satisfies a predetermined condition in each perturbation round, determines that decoding is successful; and
when the decoding result of the received signal fails to satisfy the predetermined condition in each perturbation round, proceeds to a next perturbation round among the plurality of perturbation rounds,
wherein the plurality of perturbation rounds comprise a plurality of first perturbation rounds for performing the perturbation on a corresponding one symbol among the plurality of received symbols.

14. The apparatus of claim 13, wherein the plurality of perturbation rounds proceed in an ascending order of a number of corresponding received symbols, and
wherein when the number of the corresponding received symbols is same, the plurality of perturbation rounds proceed in an ascending order of reliability of the corresponding received symbols.

15. The apparatus of claim 13, wherein the processor sets a dimension of the perturbation space to be equal to the maximum number of perturbation rounds when the maximum number of perturbation rounds is less than or equal to the code length of the received signal.

16. The apparatus of claim 13, wherein the processor sets a dimension of the perturbation space to be equal to the code length of the received signal when the maximum number of perturbation rounds is greater than the code length of the received signal,
wherein the plurality of perturbation rounds further comprise at least one second perturbation round proceeds after the plurality of first perturbation rounds,
wherein the at least one second perturbation round performs the perturbation on corresponding s received symbols among the plurality of received symbols, and
wherein s is an integer greater than one.

17. An LDPC decoding apparatus of a received signal including a plurality of received symbols, the LDPC decoding apparatus comprising:
a memory that stores one or more instructions; and
a processor that by executing the one or more instructions:
sets the plurality of received symbols as a perturbation space;
performs a plurality of perturbation rounds in parallel;
performs perturbation on a corresponding received symbol among the plurality of received symbols in each perturbation round;
decodes the received signal on which the perturbation has been performed in each perturbation round; and
when there is a perturbation round in which a decoding result of the received signal satisfies a predetermined condition among the plurality of perturbation rounds, determines that decoding is successful,
wherein the plurality of perturbation rounds comprise a plurality of first perturbation rounds for performing the perturbation on a corresponding one symbol among the plurality of received symbols.

18. The apparatus of claim 17, wherein the plurality of perturbation rounds are assigned in an ascending order of a number of corresponding received symbols, wherein when the number of the corresponding received symbols is same, the plurality of perturbation rounds are assigned in an ascending order of reliability of the corresponding received symbols, and wherein the processor determines whether the decoding is successful in an assigned order of the plurality of perturbation rounds.

19. The apparatus of claim 17, wherein the processor sets a dimension of the perturbation space to be equal to a maximum number of perturbation rounds when the maximum number of perturbation rounds is less than or equal to a code length of the received signal.

20. The apparatus of claim 17, wherein the processor sets a dimension of the perturbation space to be equal to a code length of the received signal when a maximum number of perturbation rounds is greater than the code length of the received signal, wherein the plurality of perturbation rounds further comprise at least one second perturbation round, wherein the at least one second perturbation round performs the perturbation on corresponding s received symbols among the plurality of received symbols, and wherein s is an integer greater than one.

* * * * *